United States Patent
Fotouhi

[11] Patent Number: 5,914,627
[45] Date of Patent: Jun. 22, 1999

[54] ISOLATION CIRCUIT FOR I/O TERMINAL

[75] Inventor: Bahram Fotouhi, Cupertino, Calif.

[73] Assignee: Exar Corporation, Fremont, Calif.

[21] Appl. No.: 08/948,281

[22] Filed: Oct. 9, 1997

[51] Int. Cl.[6] .................................................. H03K 17/62
[52] U.S. Cl. ........................... 327/404; 327/389; 327/401
[58] Field of Search ...................................... 327/389, 391, 327/401, 403, 404

[56] References Cited

U.S. PATENT DOCUMENTS

| | | | |
|---|---|---|---|
| 4,397,000 | 8/1983 | Nagami | 365/189 |
| 4,403,192 | 9/1983 | Williman | 328/152 |
| 4,634,895 | 1/1987 | Luong | 307/350 |
| 4,841,180 | 6/1989 | Kraus | 307/530 |
| 5,022,007 | 6/1991 | Arimoto et al. | 365/201 |
| 5,623,446 | 4/1997 | Hisada et al. | 365/189.11 |
| 5,625,308 | 4/1997 | Matsumoto et al. | 327/203 |
| 5,828,241 | 10/1998 | Sukegawa | 327/67 |

*Primary Examiner*—Timothy P. Callahan
*Assistant Examiner*—An T. Luu
*Attorney, Agent, or Firm*—Townsend and Townsend and Crew LLP

[57] ABSTRACT

Circuits and method for isolating internal nodes of an integrated circuit from external signals applied to I/O terminals of the IC even under no-power conditions are disclosed. The invention senses the most positive voltage level (in case of a p-channel implementation) or the most negative voltage level (in case of an n-channel implementation) at two input or input/output (I/O) pads and uses that voltage to isolate the internal nodes of the integrated circuit from the pad, without requiring the circuit power supply for its operation.

14 Claims, 1 Drawing Sheet

ISOLATION CIRCUIT FOR I/O TERMINAL

BACKGROUND OF THE INVENTION

The present invention relates generally to integrated circuits and in particular to a method and circuitry for isolating internal circuitry of an integrated circuit from its I/O terminals.

Integrated circuits developed for applications such as data or telecommunication systems are often required to comply with certain transmission protocols and standardized interface specifications. Some transmission protocols require that the input/output (I/O) circuitry inside an integrated circuit that connects to the transmission line not draw excessive currents from the transmission line. Thus, the integrated circuit must be designed such that the internal I/O circuitry can be electrically isolated from the transmission line. Under normal operating conditions, transistor switches can be used such that when turned off the internal I/O circuit is disconnected from the I/O terminals (or pads). However, the problem arises when power is removed from the integrated circuit and conventional circuits fail to operate properly to control the isolation transistor switches. The transmission protocols still require minimum current loading by the integrated circuit even under no power condition.

There is therefore a need for circuitry that is capable of isolating internal I/O nodes of an integrated circuit from the I/O pads.

SUMMARY OF THE INVENTION

The present invention provides method and apparatus for controlling isolation circuitry internal to an integrated circuit to disconnect internal nodes of the circuit from its I/O terminals, even under no power conditions. Broadly, the present invention senses the most positive voltage level (in case of a p-channel implementation) or the most negative voltage level (in case of an n-channel implementation) at two input or input/output (I/O) pads and uses that voltage to isolate the internal nodes of the integrated circuit from the pad, without requiring the circuit power supply for its operation.

Accordingly, in one embodiment, the present invention provides a circuit for isolating internals nodes of an integrated circuit from external connectors, the circuit including a first switch transistor having a current-carrying path coupled between a first internal node an a first external connector; a second switch transistor having a current-carrying path coupled between a second internal node and a second external connector; a level detect circuit coupled to the external connectors for detecting a relative signal level between a first signal at the first external connector and a second signal at the second external connector; and a signal transfer circuit coupled between the level detect circuit and the first and second switch transistors, the signal transfer circuit coupling one of the first or second signals to control terminals of the first and second switch transistors.

In a specific embodiment, the present invention provides a circuit for isolating internals nodes of an integrated circuit from external connectors, the circuit including a first p-channel transistor having a first source/drain terminal coupled to a first external node, a second source/drain terminal coupled to a first internal node, and a gate terminal; a second p-channel transistor having a first source/drain terminal coupled to a second external node, a second source/drain terminal coupled to a second internal node, and a gate terminal; a voltage detect circuit coupled to the first and second external nodes for detecting the largest voltage level between a first signal at the first external node and a second signal at the second external node; and a voltage transfer circuit for transferring the largest voltage level to the gate terminals of the first and second p-channel transistors, when there is no power supplied to the circuit.

In yet another embodiment, the present invention provides a method of isolating nodes internal to an integrated circuit from external signal on external connectors to the integrated circuit, the method including the steps of: (A) detecting the largest of two signals respectively applied to two external connectors; (B) supplying the largest of the two signals to a p-channel pass transistor; (C) pulling down to a low potential a gate terminal of the p-channel pass transistor when no power is applied to the integrated circuit; and (D) coupling the largest of the two signal to gate terminals of p-channel switch transistors to turn them off and to disconnect internal nodes from signals on the two external connectors.

A better understanding of the nature and advantages of the present invention may be had with reference to the detailed description and the drawing below.

DESCRIPTION OF THE PREFERRED EMBODIMENT

Figure 1:
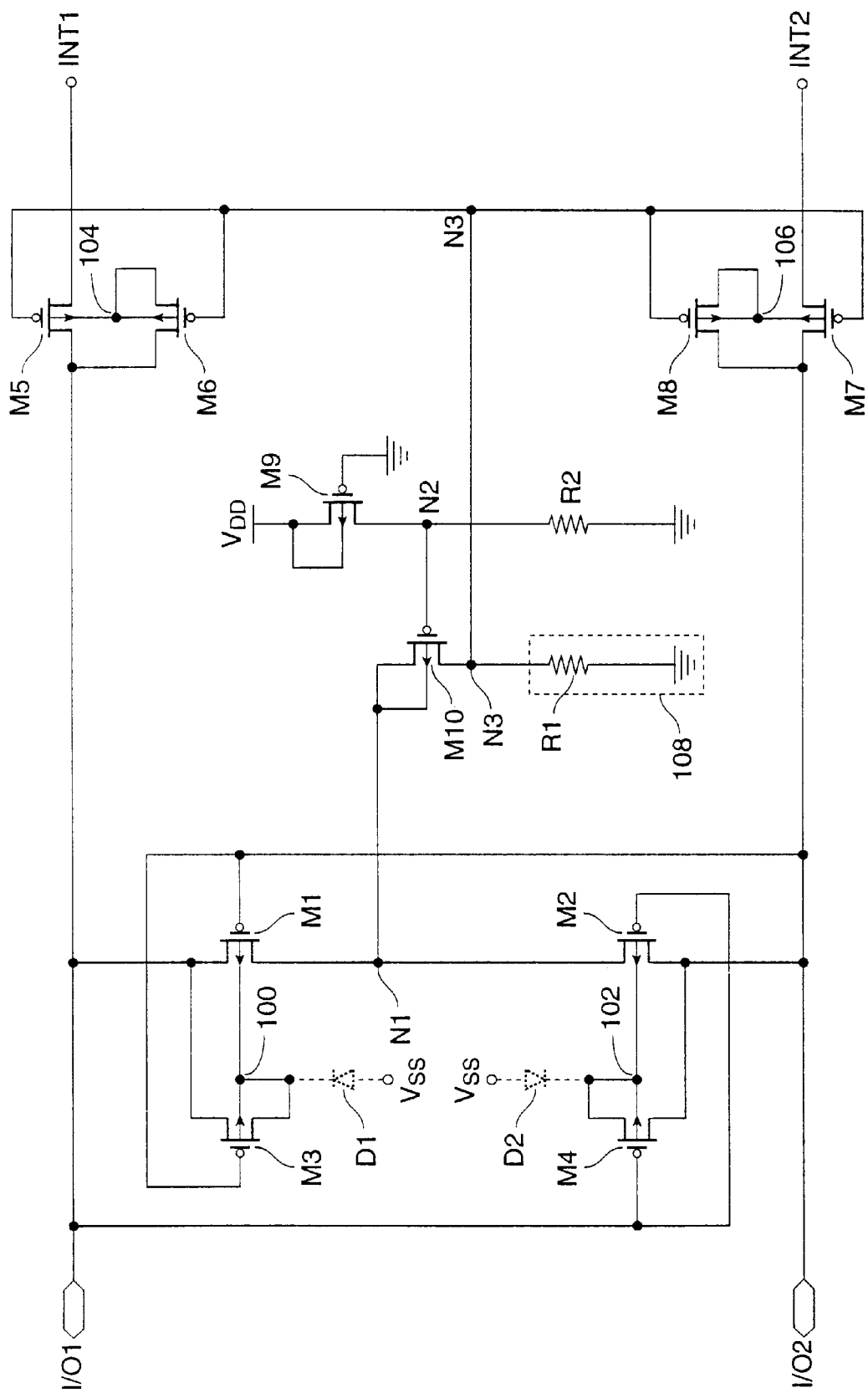
FIG. 1 is a circuit schematic of the I/O terminal isolation circuit according to an exemplary embodiment of the present invention.

In accordance with the teachings of the present invention circuitry is provided to isolate internal nodes of an integrated circuit (IC) chip from external connectors, even when the power to the integrated circuit if off. Referring to FIG. 1, there is shown a circuit schematic of the isolation circuit according to an exemplary embodiment of the present invention. The circuit includes a pair of p-channel transistors M1 and M2 that have a common source/drain terminal connection at node N1, and whose gate and other source/drain terminals are cross-coupled between two input/output (I/O) terminals I/O1 and I/O2 that connect to external circuitry. Terminals I/O1 and I/O2 are referred to herein as input/output terminals, but they may be input-only terminals. Terminals I/O1 and I/O2 are typically pads on the IC chip that are wire-bonded to external pins on the IC package. Transistor M1 connects to another p-channel transistor M3 that when turned on connects the bulk (N-well) terminal 100 of p-channel transistor M1 to one of its source/drain terminals at I/O1. Transistor M2 connects in a similar fashion to a fourth p-channel transistor M4.

Node N1 connects to a source/drain terminal of a p-channel transistor M10 whose other source/drain terminal, node N3, is pulled down to a low potential by a pull-down circuit 108 shown by resistive element R1 for illustrative purposes. The gate terminal of p-channel transistor M10 is pulled up to the high power supply node VDD by a p-channel transistor M9 whose gate is grounded. A resistive pull-down R2 couples node N2 to ground. Node N3 drives the gate terminals of four p-channel transistors M5, M6, M7, and M8. P-channel transistors M5 and M7 act as the isolation switches that connect and disconnect internal nodes INT1 and INT2 from I/O1 and I/O2. Transistor M6 and M8 provide the connection to the bulk terminals 104 and 106 of M6 and M8, respectively.

In operation, under power off condition (i.e., VDD=0 volts), if I/O1 is more positive than I/O2 by one p-channel transistor threshold voltage Vtp, transistors M1 and M3 turn on due to a negative voltage greater than one Vtp across their gate-to-source terminals. This connects I/O1 to node N1 while at the same time common bulk terminal 100 (N-well) of transistors M1 and M3 connects to I/O1 via transistor M3. Connecting the bulk terminal of transistor M1 to the highest potential I/O1 ensures that its threshold voltage is minimized by reducing body effect on transistor M1. P-channel transistors M2 and M4 are off due to a positive voltage across their gate-to-source terminals. The common bulk terminal 102 (N-well) of transistors M2 and M4 is left floating, and will rise to a potential one diode drop below the voltage at node N1 due to the forward-biased drain-to-bulk diodes of M2 and M4. The parasitic vertical bipolar PNP transistor associated with transistors M2 and M4 will not conduct any current since their base (i.e., N-well bulk to transistors M2 and M4) is floating.

When I/O2 is more positive than I/O1 by one Vtp, transistors M1 and M3 turn off while transistors M2 and M4 turn on. Similar biasing conditions apply to the four transistors but in reverse. Under both conditions, however, the most positive voltage is applied to node N1 which connects to the source terminal of p-channel transistor M10. In the absence of a power supply voltage at VDD, p-channel transistor M9 is off allowing resistive element R2 to pull down the gate terminal of p-channel transistor M10 at node N2 to ground. Thus, if the voltage level at node N1 exceeds ground potential by one Vtp, p-channel transistor M10 turns on bringing the potential at node N3 to the same level as that of node N1. Pull-down circuit 108 may draw a small amount of current from node N1, slightly reducing the voltage level at node N3 as compared to the voltage level at node N1.

The voltage level at node N3 is thus pulled to the most positive voltage level at either one of the two terminals I/O1 and I/O2. Since N3 connects to the gate terminals of p-channel transistors M5, M6, M7 and M8, all these devices are turned off with their common bulk terminals (N-wells) 104 and 106 floating. This effectively isolates nodes INT1 and INT2 that connect to the internal circuitry from interface terminals I/O1 and I/O2.

If the signals at I/O1 and I/O2 terminals are both negative, the circuit of the present invention operates in a similar fashion to connect nodes N1 and N3 to the most positive voltage at the terminals. One difference in the operation of the circuit when receiving negative voltages is the possibility that the N-well of transistors M3 and M4 will be forward biased turning on either one or both N-well diodes D1 and D2 shown in phantom. This current, however, can be made arbitrarily small by choosing small width to length ratio (W/L) for p-channel transistors M3 and M4.

It is well known in the art that I/O pads are commonly protected from electrostatic discharge (ESD) and latch-up conditions by the provision of protection circuitry. It is to be understood that for the circuit of the present invention to operate as described above, such I/O pad protection circuitry may not have the classical diodes connecting from the pad to the positive and negative power supplies.

When the circuit is powered and driving the I/O terminals, internal nodes INT1 and INT2 connect to I/O1 and I/O2 respectively. With power applied to VDD, p-channel transistor M9 turns on pulling node N2 to VDD. This causes p-channel transistor M10 to turn off, allowing pull-down circuit 108 to pull down the voltage at node N3 to a low potential. With N3 at a low potential, all four p-channel transistors M5, M6, M7, and M8 turn on coupling INT1 and INT2 to I/O1 and I/O2, respectively. A preferred embodiment for pull-down circuit 108 is a charge pump circuit that generates a negative voltage (e.g., −2 VDD) when power is applied, and otherwise exhibits high-impedance characteristics when power is off. An example of an all p-channel charge pump circuit suitable for use as pull-down circuit 108 is described in detail in commonly-assigned patent application Ser. No. 08/808,813, entitled "Negative Charge Pump Circuit," by Fotouhi et al.

Thus, the present invention offers method and apparatus for controlling isolation circuitry internal to an integrated circuit to disconnect internal nodes of the circuit from its I/O terminals, even under no power conditions. The invention senses the most positive voltage level at two input or output (or I/O) pads and uses that voltage to isolate the internal nodes of the integrated circuit from the pad, without requiring the circuit power supply for its operation. While the above is a complete description of the preferred embodiment of the present invention, it is possible to use various alternatives, modifications and equivalents. For example, the use of p-channel transistors in an n-well process is for illustrative purposes only, and a similar circuit utilizing n-channel transistors in a p-well process would provide the same operational advantages as the embodiment disclosed. Therefore, the scope of the present invention should be determined not with reference to the above description but should, instead, be determined with reference to the appended claims, along with their full scope of equivalents.

What is claimed is:

1. A circuit for isolating internals nodes of an integrated circuit from external connectors, the circuit comprising:

a first switch transistor having a current-carrying path coupled between a first internal node an a first external connector, said first switch transistor having a control terminal;

a second switch transistor having a current-carrying path coupled between a second internal node and a second external connector, said second switch transistor having a control terminal;

a level detect circuit coupled to said first external connector and said second external connector for detecting a relative signal level between a first signal at said first external connector and a second signal at said second external connector; and a signal transfer circuit coupled between said level detect circuit and said first and second switch transistors, said signal transfer circuit coupling one of said first or second signals to said control terminals of said first and second switch transistors.

2. The circuit of claim 1 further comprising:

a third switch transistor having a first source/drain terminal coupled to a first source/drain terminal of said first switch transistor, a well terminal and a second source/drain terminal both coupled to a well terminal of said first switch transistor, and a control terminal coupled to said control terminal of said first switch transistor; and a fourth switch transistor having a first source/drain terminal coupled to a first source/drain terminal of said second switch transistor, a well terminal and a second source/drain terminal both coupled to a well terminal of said second switch transistor, and a control terminal coupled to said control terminal of said second switch transistor.

3. The circuit of claim 1 wherein said first and second switch transistors comprise p-channel field-effect transistors.

4. The circuit of claim 3 wherein said level detect circuit detects the largest signal of said first and second signals, and wherein said signal transfer circuit couples said largest signal to gate terminals of said first and second switch transistors.

5. The circuit of claim 4 further comprising:
a third switch transistor of p-channel type having a first source/drain terminal coupled to a first source/drain terminal of said first switch transistor, an n-well terminal and a second source/drain terminal both coupled to an n-well terminal of said first switch transistor, and a gate terminal coupled to said control terminal of said first switch transistor; and
a fourth switch transistor of p-channel type having a first source/drain terminal coupled to a first source/drain terminal of said second switch transistor, an n-well terminal and a second source/drain terminal both coupled to an n-well terminal of said second switch transistor, and a gate terminal coupled to said control terminal of said second switch transistor.

6. The circuit of claim 4 wherein said level detect circuit comprises:
a first p-channel transistor having a first source/drain terminal coupled to said first external connector, a second source/drain terminal coupled to an output node, and a gate terminal coupled to said second external connector; and
a second p-channel transistor having a first source/drain terminal coupled to said second external connector, a second source/drain terminal coupled to said output node, and a gate terminal coupled to said first external connector.

7. The circuit of claim 6 wherein said signal transfer circuit comprises:
a first p-channel transistor having a first source/drain terminal coupled to said output node of said level detect circuit, and a second source/drain terminal coupled to said control terminals of said first and second switch transistors;
a first pull-down circuit coupling said second source/drain terminal of said first p-channel transistor of said signal transfer circuit to a low potential;
a second p-channel transistor having a first source/drain terminal coupled to a power supply node, a second source/drain terminal coupled to a gate terminal of said first p-channel transistor of said signal transfer circuit, and a gate terminal coupled to a low potential; and
a second pull-down circuit coupling said second source/drain terminal of said second p-channel transistor of said signal transfer circuit to a low potential.

8. The circuit of claim 6 wherein said level detect circuit further comprises:
a third p-channel transistor having a first source/drain terminal coupled to a first source/drain terminal of said first p-channel transistor in said level detect circuit, an n-well terminal and a second source/drain terminal both coupled to an n-well terminal of said first p-channel transistor of said level detect circuit, and a gate terminal coupled to said gate terminal of said first p-channel transistor of said level detect circuit; and
a fourth p-channel transistor having a first source/drain terminal coupled to a first source/drain terminal of said second p-channel transistor of said level detect circuit, an n-well terminal and a second source/drain terminal both coupled to an n-well terminal of said second p-channel transistor of said level detect circuit, and a gate terminal coupled to said gate terminal of said second p-channel transistor of said level detect circuit.

9. The circuit of claim 7 wherein said first pull-down circuit is a negative charge pump circuit.

10. A circuit for isolating internals nodes of an integrated circuit from external connectors, the circuit comprising:
a first p-channel transistor having a first source/drain terminal coupled to a first external node, a second source/drain terminal coupled to a first internal node, and a gate terminal;
a second p-channel transistor having a first source/drain terminal coupled to a second external node, a second source/drain terminal coupled to a second internal node, and a gate terminal;
a voltage detect circuit coupled to said first and second external nodes for detecting the largest voltage level between a first signal at said first external node and a second signal at said second external node; and
a voltage transfer circuit for transferring said largest voltage level to said gate terminals of said first and second p-channel transistors, when there is no power supplied to said circuit.

11. The circuit of claim 10 wherein said voltage detect circuit comprises third and fourth p-channel transistors having first source/drain terminals coupled together and second source/drain and gate terminals cross-coupled between said first and second external nodes.

12. The circuit of claim 11 wherein each one of said first, second, third, and fourth p-channel transistors has a corresponding p-channel transistor coupled to it for coupling an n-well terminal of each to a source/drain terminal of each.

13. The circuit of claim 11 wherein said voltage transfer circuit comprises:
a p-channel pass transistor having a first source/drain terminal coupled to said first source/drain terminals of said third and fourth p-channel transistors, a second source/drain terminal coupled to gate terminals of said first and second p-channel transistors, and a gate terminal;
a p-channel pull-up transistor having a first source/drain terminal coupled to a power supply node, a second source/drain terminal coupled to said gate terminal of said p-channel pass transistor, and a gate terminal coupled to a low potential;
a first pull-down circuit coupling said second source/drain terminal of said p-channel pass transistor to a low potential; and
a second pull-down circuit coupling said second source/drain terminal of said p-channel pull-up transistor to a low potential.

14. A method of isolating nodes internal to an integrated circuit from external signal on external connectors to the integrated circuit, the method comprising the steps of:
(A) detecting the largest of two signals respectively applied to two external connectors;
(B) supplying the largest of the two signals to a p-channel pass transistor;
(C) pulling down to a low potential a gate terminal of said p-channel pass transistor when no power is applied to the integrated circuit; and
(D) coupling the largest of the two signal to gate terminals of p-channel switch transistors to turn them off and to disconnect internal nodes from signals on the two external connectors.

* * * * *